(12) United States Patent  
Sakaguchi et al.

(10) Patent No.: US 9,305,641 B2  
(45) Date of Patent: Apr. 5, 2016

(54) RESISTANCE CHANGE MEMORY AND FORMING METHOD OF THE RESISTANCE CHANGE DEVICE

(71) Applicant: RENESAS ELECTRONICS CORPORATION, Kanagawa (JP)

(72) Inventors: Tomonori Sakaguchi, Kanagawa (JP); Masayuki Terai, Kanagawa (JP); Koichi Yako, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 110 days.

(21) Appl. No.: 13/905,951

(22) Filed: May 30, 2013

(65) Prior Publication Data

US 2013/0336043 A1    Dec. 19, 2013

(30) Foreign Application Priority Data

Jun. 19, 2012    (JP) .................................. 2012-137826

(51) Int. Cl.
| | | |
|---|---|---|
| G11C 11/00 | (2006.01) | |
| G11C 13/00 | (2006.01) | |
| H01L 45/00 | (2006.01) | |

(52) U.S. Cl.
CPC ........ G11C 13/0002 (2013.01); G11C 13/0007 (2013.01); H01L 45/04 (2013.01); H01L 45/1253 (2013.01); H01L 45/146 (2013.01); H01L 45/16 (2013.01);
(Continued)

(58) Field of Classification Search
CPC .................. G11C 13/0004; G11C 11/14–11/16
USPC ........................... 365/148, 163, 158, 171, 173
See application file for complete search history.

(56) References Cited

U.S. PATENT DOCUMENTS

| | | | |
|---|---|---|---|
| 8,023,313 | B2 | 9/2011 | Toda |
| 8,054,674 | B2 | 11/2011 | Tamai et al. |
| 8,537,595 | B2 | 9/2013 | Toda |

(Continued)

FOREIGN PATENT DOCUMENTS

| | | |
|---|---|---|
| JP | 2008-306157 A | 12/2008 |
| JP | 2010-55719 A | 3/2010 |

OTHER PUBLICATIONS

W. W. Zhuang, et al., "Novell Colossal Magnetoresistive Thin Film Nonvolatile Resistance Random Access Memory (RRAM)", IEDM, 2002, pp. 193-196.

(Continued)

*Primary Examiner* — Han Yang  
(74) *Attorney, Agent, or Firm* — Sughrue Mion, PLLC

(57) ABSTRACT

A resistance change memory has a resistance change device and a control circuit for controlling application of voltage to the resistance change device. The resistance change device has a first electrode, a second electrode, and a resistance change layer interposed between the first electrode and the second electrode. A material for the second electrode includes one of members selected from the group consisting of W, Ti, Ta, and nitrides thereof. During forming of the resistance change device, the control circuit performs a second forming treatment succeeding to a first forming treatment. The first forming treatment includes application of voltage such that the potential of the first electrode is higher than the potential of the second electrode. The second forming treatment includes application of voltage such that the potential of the second electrode is higher than the potential of the first electrode.

9 Claims, 13 Drawing Sheets

(52) U.S. Cl.
CPC ....... *H01L 45/1608* (2013.01); *G11C 13/0069* (2013.01); *G11C 2213/32* (2013.01); *G11C 2213/79* (2013.01)

(56) References Cited

U.S. PATENT DOCUMENTS

| | | | |
|---|---|---|---|
| 2007/0008773 A1* | 1/2007 | Scheuerlein | 365/161 |
| 2010/0054019 A1 | 3/2010 | Toda | |
| 2010/0172170 A1 | 7/2010 | Tamai et al. | |
| 2011/0310656 A1* | 12/2011 | Kreupl et al. | 365/148 |
| 2012/0002458 A1 | 1/2012 | Toda | |
| 2012/0195100 A1* | 8/2012 | Saitoh | G11C 13/0007 365/148 |

OTHER PUBLICATIONS

Gyeong-Su Park, et al., "Observation of electric-field induced Ni filament channels in polycrystalline NiOx film", APL, 2007, pp. 222103-1-22203-3, vol. 91.

Chikako Yoshida, et al., "High speed resistive switching in Pt/TiO2/TiN film for nonvolatile memory application", APL, 2007, pp. 223510-1-22510-2, vol. 91.

M. Terai, et al., "High Thermal Robust ReRAM with a New Method for Suppressing Read Disturb", 2011 Symposium on VLSI Technology, Digest of Technical Papers, 2011, pp. 50-51.

Japanese Office Action dated Dec. 15, 2015 corresponding to JP Application No. 2012-137826.

* cited by examiner

<Forming>

RESISTANCE CHANGE MEMORY AND FORMING METHOD OF THE RESISTANCE CHANGE DEVICE

CROSS-REFERENCE TO RELATED APPLICATIONS

The disclosure of Japanese Patent Application No. 2012-137826 filed on Jun. 19, 2012 including the specification, drawings, and abstract is incorporated herein by reference in its entirety.

BACKGROUND

The present invention relates to a resistance change memory and a forming method of a resistance change device.

Resistance change memories (ReRAM: Resistance RAM) have been known as a kind of volatile memories (for example, refer to: W. W. Zhuang, et al., "Novell Colossal Magnetoresistive Thin Film Nonvolatile Resistance Random Access Memory (RRAM)", IEDM, 7.5, pp. 193-196, 2002 (Non-Patent Document 1), G. -S. Park, et al., "Observation of electric-field induced Ni filament channels in polycrystalline $NiO_x$ film", APL, Vol. 91, pp. 222103, 2007 (Non-Patent Document 2), C. Yoshida et al., "High speed resistive switching in $Pt/TiO_2/TiN$ film for nonvolatile memory application" APL, Vol. 91, pp. 223510, 2007 (Non-Patent Document 3), and M. Terai et al., "High Thermal Robust ReRAM with a New Method for Suppressing Read Disturb", 2011 Symposium on VLSI Technology, Digest of Technical Papers, pp. 50-51, 2011 (Non-Patent Document 4)).

The resistance change memory uses a resistance change device as a memory cell and stores data based on the change of the resistance in a non-volatile manner.

As shown in FIG. 1, a typical resistance change device has a first electrode 110, a second electrode 120, and a resistance change layer 130 interposed between the first electrode 110 and the second electrode 120. By applying voltage between the first electrode 110 and the second electrode 120, the resistance value of the resistance change layer 130 can be changed thereby capable of rewriting data.

In the Non-Patent Document 1, a PCMO ($Pr_{0.7}Ca_{0.3}MnO_3$) film and a YBCO ($YBa_2Cu_3O_y$) film are used as the resistance change layer 130.

In the Non-Patent Document 2, a polycrystal $NiO_x$ (x=1 to 1.5) film of about 50 nm thickness is used as the resistance change layer 130.

In the Non-Patent Document 3, a crystallite $TiO_2$ film of 80 nm thickness is used as the resistance change layer 130.

In the Non-Patent Document 4, different materials are used for the first electrode 110 and the second electrode 120 (asymmetric electrode) with an aim of decreasing read disturb. For example, the material for the first electrode 110 is Ru and the material for the second electrode 120 is W.

When such a resistance change device is utilized, a treatment referred to as "forming" is necessary for initial setting. Forming is to form a conduction path referred to as "filament" in the resistance change layer 130 by application of a high voltage between the first electrode 110 and the second electrode 120. It is considered that the filament is formed by collection of defects in the resistance change layer 130.

As illustrated in FIG. 1, a filament 140 (conduction path) is formed in the resistance change layer 130 so as to connect the first electrode 110 and the second electrode 120. The state corresponds to "an ON state" in which the resistance of the resistance change device is low. After the forming, ON/OFF switching is possible.

SUMMARY

When the filament 140 is not formed completely by the forming, electric connection between the first electrode 110 and the second electrode 120 is not complete. This means that a resistance change device of high ON resistance (high ON resistance cell) is formed. Increase of the high ON resistance cell varies the resistance value greatly, and imposes a problem of deteriorating read characteristics, etc. of the resistance change memory.

Other subjects and novel features of the invention will be apparent with reference to the description of the present specification and the accompanying drawings.

According to an aspect of the present invention, there is provided a resistance change memory. The resistance change memory has a resistance change device and a control circuit for controlling voltage application to the resistance change memory. The resistance change device has a first electrode, a second electrode, and a resistance change layer interposed between the first electrode and the second electrode. The material for the second electrode includes one member selected from the group consisting of W, Ti, Ta and nitrides thereof. In the forming of the resistance change device, the control circuit performs a first forming treatment and a second forming treatment succeeding to the first forming method. The first forming treatment includes application of voltage such that the potential of the first electrode is higher than the potential of the second electrode. The second forming treatment includes application of voltage such that the potential of the second electrode is higher than the potential of the first electrode.

According to another aspect of the present invention, there is provided a forming method of a resistance change device. The resistance change device has a first electrode, a second electrode, and a resistance change layer interposed between the first electrode and the second electrode. The material for the second electrode includes one member selected from the group consisting of W, Ti, Ta, and nitrides thereof. The forming method includes a first forming treatment and a second forming treatment that is performed succeeding to the first forming treatment. The first forming treatment includes application of voltage such that the potential of the first electrode is higher than the potential of the second electrode. The second forming treatment includes application of voltage such that the potential of the second electrode is higher than the potential of the first electrode.

In the forming of the resistance change device, a satisfactory filament is formed to suppress occurrence of a high ON resistance cell. As a result, dispersion of the resistance values is decreased to improve the characteristics of the resistance change memory.

DETAILED DESCRIPTION

1. First Embodiment
1-1 Configuration of Resistance Change Device

Figure 1:
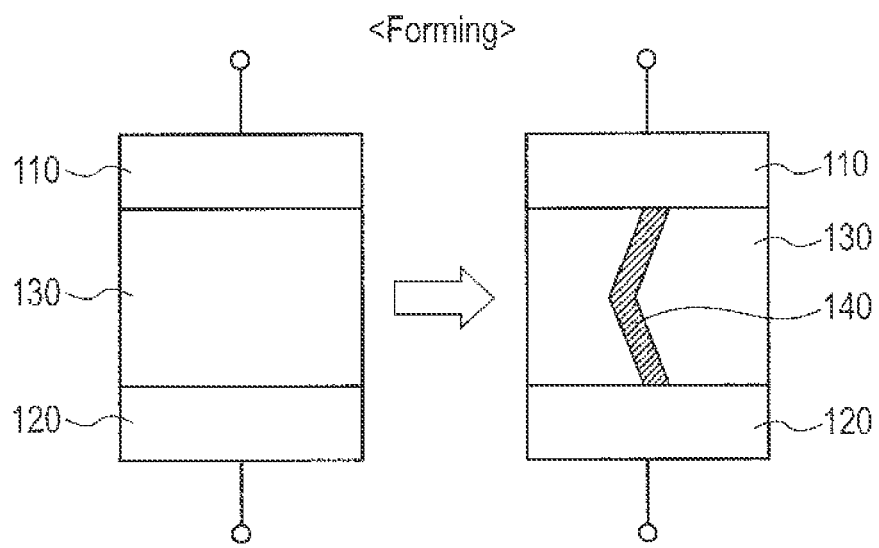
FIG. 1 is a conceptional view illustrating a forming method of a typical resistance change device.
Figure 2:
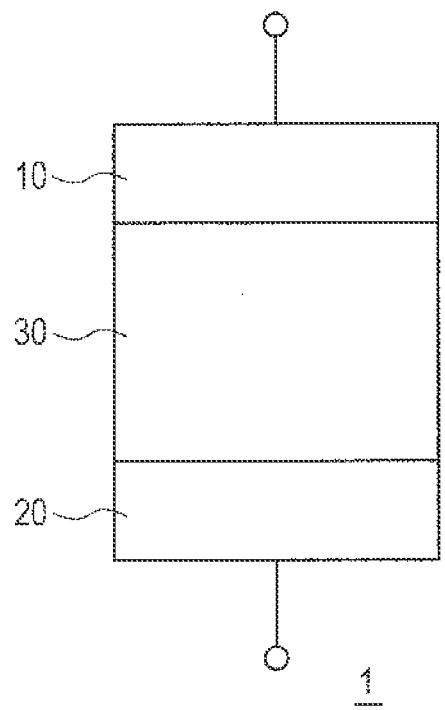
FIG. 2 illustrates a configuration of a resistance change device according to a first embodiment.

FIG. 2 illustrates a configuration of a resistance change device 1 according to a first embodiment. The resistance change device 1 has a first electrode 10, a second electrode 20, and a resistance change layer 30 interposed between the first electrode 10 and the second electrode 20. The resistance value of the resistance change layer 30 can be switched by applying a voltage between the first electrode 10 and the second electrode 20 thereby capable of rewriting data.

The material for the resistance change layer 30 includes insulators comprising, for example, $Ta_2O_5$, $HfO_2$, $ZrO_2$, $TiO_2$, and $Al_2O_3$.

It is preferred that the material for the first electrode 10 and the material for the second electrode 20 are different (asymmetric electrode). For example, the material for the first electrode 10 comprises Ru or Pt and the material for the second electrode 20 comprises W, Ti, Ta, or nitrides thereof. The reason that the asymmetric electrode is preferred is to be described later.

Various controls are performed by application of voltage on the first electrode 10 and the second electrode 20. In the following description, application of voltage such that the potential of the first electrode 10 is higher than the potential of the second electrode 20 is simply referred to as "positive voltage is applied on the first electrode 10". On the contrary, application of voltage such that the potential of the second electrode 20 is higher than the potential of the first electrode 10 is simply referred to as "positive voltage is applied on the second electrode 20".

1-2 Forming Method

Figure 3:
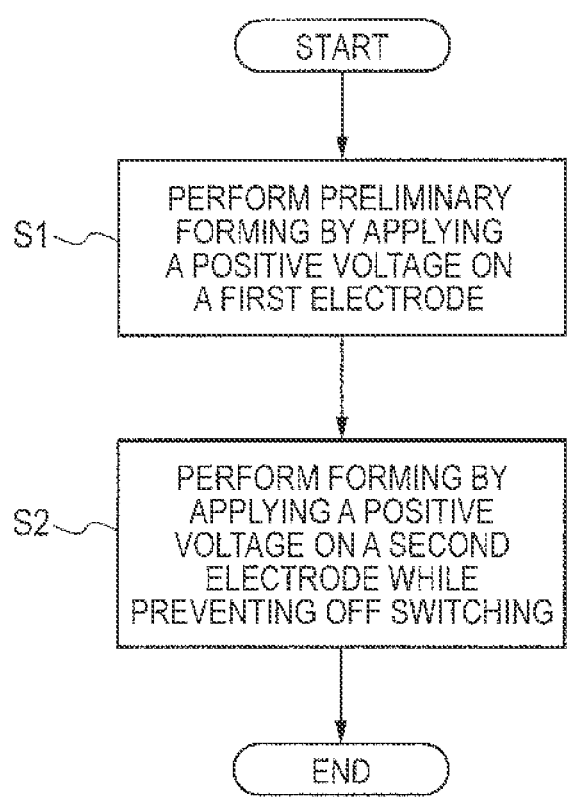
FIG. 3 is a flow chart showing a forming method according to the first embodiment.
Figure 4:
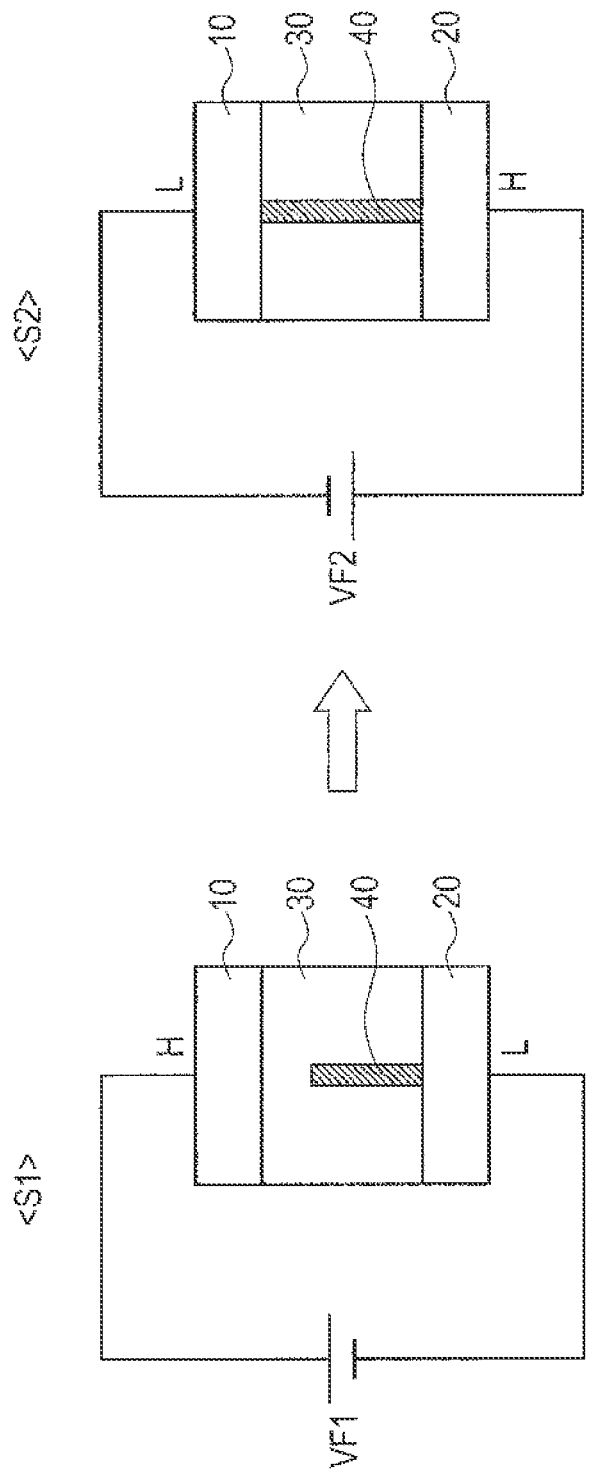
FIG. 4 is a schematic view illustrating a forming treatment according to the first embodiment.

FIG. 3 is a flow chart illustrating a forming method according to the first embodiment. FIG. 4 is a conceptional view illustrating a forming treatment according to the first embodiment. The forming treatment according to the first embodiment is to be described specifically with reference to FIG. 3 and FIG. 4.

Step S1: First Forming Treatment

At first, a first forming treatment is carried out. In the first forming treatment, a first positive voltage VF1 is applied on the first electrode 10. In this step, electrons are injected from the second electrode 20 to the resistance change layer 30. As a result, as shown in FIG. 4, a filament 40 is formed so as to extend from the second electrode 20 to the inside of the resistance change layer 30.

However, when the filament 40 is not formed completely, electric connection between the first electrode 10 and the second electrode 20 is not complete. This means occurrence of a high ON resistance cell, which is not preferred with a view point of dispersion of the resistance values. Then, according to this embodiment, the following second forming treatment is carried out succeeding to the first forming treatment.

Step S2: Second Forming Treatment

In the second forming treatment succeeding to the first forming treatment, a voltage is applied in a direction opposite to that in the first forming treatment. That is, a second positive voltage VF2 is applied on the second electrode 20. In this step, electrons are injected from the first electrode 10 to the resistance change layer 30. As a result, as shown in FIG. 4, a filament 40 is formed also from the first electrode 10, and connected with the filament 40 formed in the step S1. Thus, the high resistance portion is eliminated to provide good electric connection between the first electrode 10 and the second electrode 20. That is, occurrence of the high ON resistance cell is suppressed.

As described above according to this embodiment, the voltage is applied at least twice during forming. It can be said that the first forming treatment is preliminary forming and the second forming treatment is finish forming. Typically, the second positive voltage VF2 applied in the finishing second forming treatment is equal to or is lower than the first positive voltage VF1 applied in the first forming treatment (VF2≤VF1). The first forming treatment and the second forming treatment are carried out as a set. It is not judged after the first forming treatment whether the second forming treatment is carried or not in accordance with the state of electric conduction. This is for avoiding complexity of the treatment and the circuit configuration.

Figure 5:
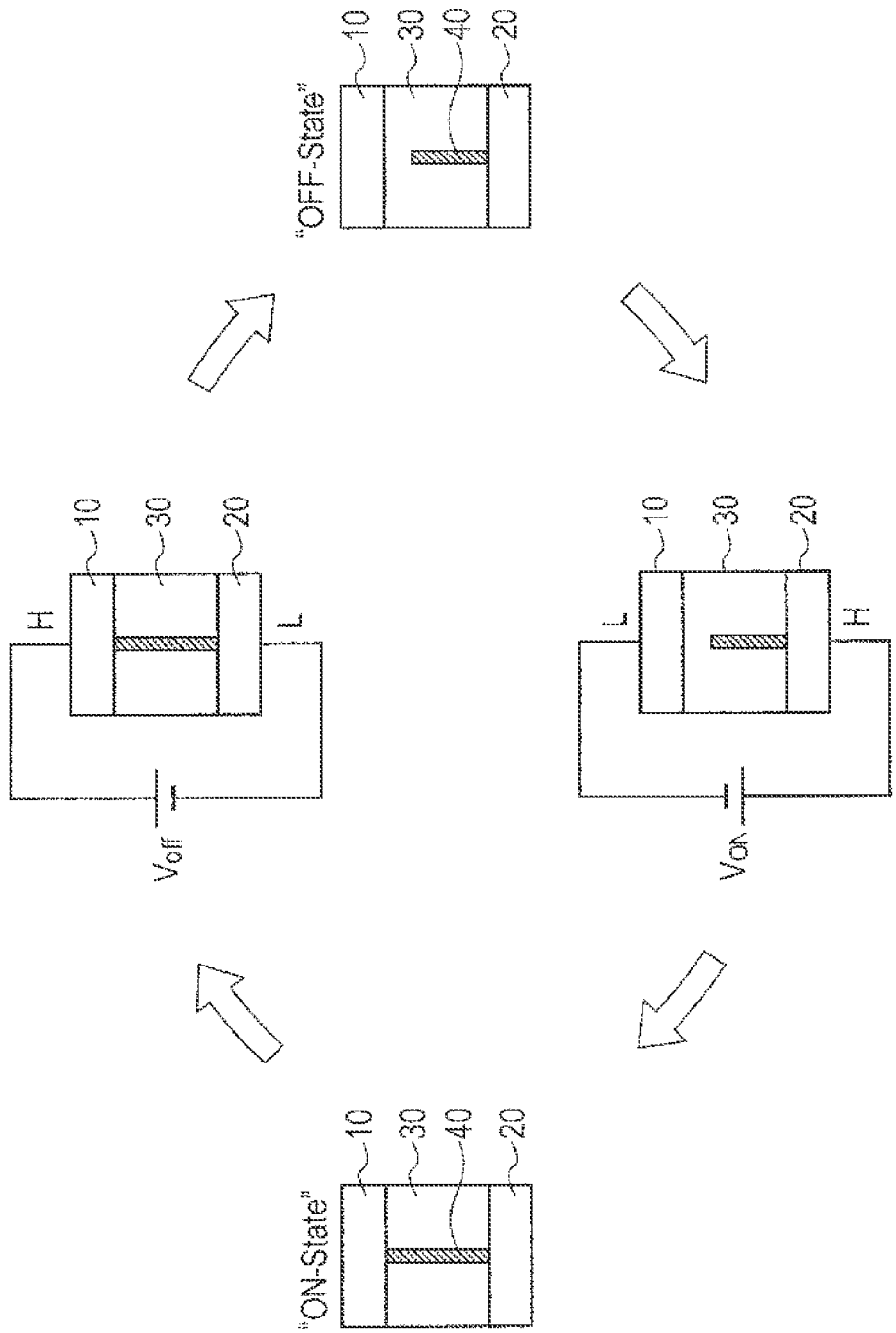
FIG. 5 is a conceptional view showing an ON/OFF switching method of the resistance change device according to the first embodiment.

FIG. 5 illustrates usual operation of the resistance change device 1 (ON/OFF switching) after the forming. Just after the forming, the first electrode 10 and the second electrode 20 are electrically conducted by way of a filament 40 and the resistance change device 1 is in "the ON state (low resistance state)".

When a positive voltage Voff is applied on the first electrode 10 in the resistance change device 1 in the ON state, a portion of the filament 40 is disconnected near the first electrode 10 on the positive side. Thus, the resistance value of the resistance change device 1 increases greatly. This is "an OFF state (high resistance state)" and change of the state of the resistance change device 1 from "the ON state (low resistance state)" to "the OFF state (high resistance state)" is "OFF switching".

On the contrary, change of the state of the resistance change device 1 from "the OFF state (high resistance state)" to "the ON state (low resistance state)" is "ON switching". In the state of ON switching, a positive voltage Von is applied on the second electrode 20. It should be noted that the direction of the application of voltage is identical with the case of the second forming treatment described above. As a result of application of the positive voltage Von on the second electrode 20, the filament 40 is formed again at the disconnected position to recover the electric connection between the first electrode 10 and the second electrode 20. That is, the state of the resistance change device 1 is again turned to "ON state (low resistance state)".

1-3 Free Energy for Oxide Formation

"Free energy for oxide formation" in each of the electrodes is to be considered. The free energy for oxide formation is a value obtained by dividing the heat of reaction upon forming an oxide by the number of oxygen atoms of the oxide. The free energy for oxide formation of main electrode materials is as follows: Ti (472.5 kJ/mol)>Ta (409.2 kJ/mol)>TiN (303.5 kJ/mol)>W (280.1 kJ/mol) >Ru (152.5 kJ/mol).

It is reported that when the free energy for oxide formation in the electrode is high, even if a positive voltage is applied to the electrode, Off switching (disconnection of filament 40) is less generated (for example, refer to the Non-Patent Document 4). Accordingly, it can be said that materials such as Ti, Ta, TiN, and W are electrode materials that less generates off switching. On the other hand, it can be said that Ru is an electrode material that relatively tends to generate OFF switching.

As has been described above according to this embodiment, a positive voltage VF2 is applied on the second electrode 20 in the second forming treatment succeeding to the first forming treatment. In this case, if the filament 40 which has been preliminarily formed in the first forming treatment is disconnected, it should be meaningless. Then, as the material for the second electrode 20, those materials having high oxide forming energy and less generating off switching are used preferably. Specifically, as the material for the second electrode 20, W, Ti, Ta and nitrides thereof are used preferably. For example, materials such as W and Ti are suitable. By using such materials for the second electrode 20, OFF switching can be prevented in the second forming treatment.

Further, since the second electrode 20 is formed of a material that less generates OFF switching, a positive voltage Voff is applied on the first electrode 10 upon OFF switching (refer to FIG. 5) in usual operation. Accordingly, the first electrode 10 is preferably formed of a material that relatively tends to generate OFF switching, that is, a material having low free energy for oxide formation. Such material includes Ru and Pt.

As described above, with a view point of OFF switching, "asymmetric electrode structure" in which materials are different between the first electrode 10 and the second electrode 20 is preferred. The free energy for oxide formation is preferably lower in the first electrode 10 and higher in the second electrode 20.

1-4 Effect

As has been described above, according to this embodiment, the second forming treatment is carried out succeeding to the first forming treatment. As a result, a satisfactory filament 40 is formed to prevent occurrence of the high ON resistance cell. As a result, dispersion of the resistance values is decreased and read characteristics, etc. of the resistance change memory are improved.

Further, due to the asymmetric electrode structure, OFF switching in the second forming treatment (step S2) can be prevented to achieve appropriate forming.

Figure 6:
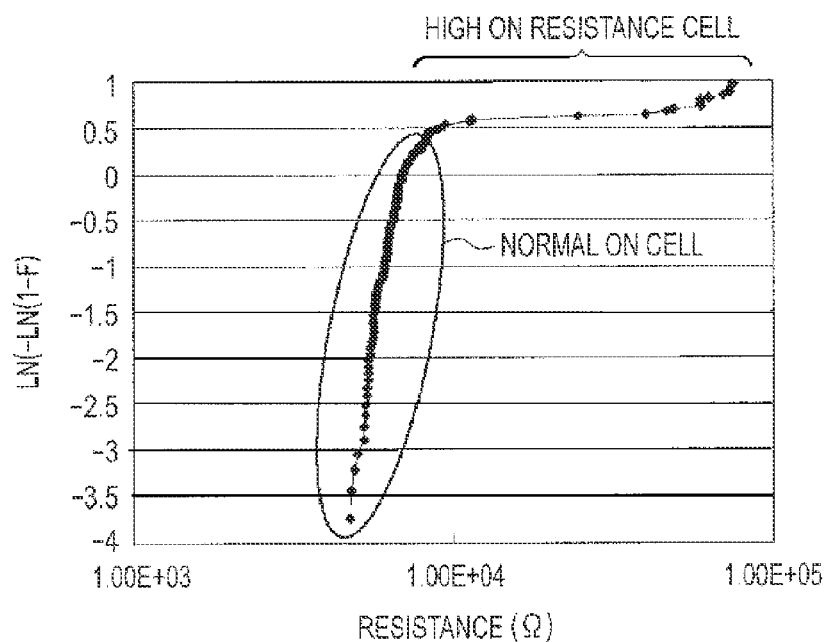
FIG. 6 is a graph for explaining the effect according to the first embodiment.
Figure 7:
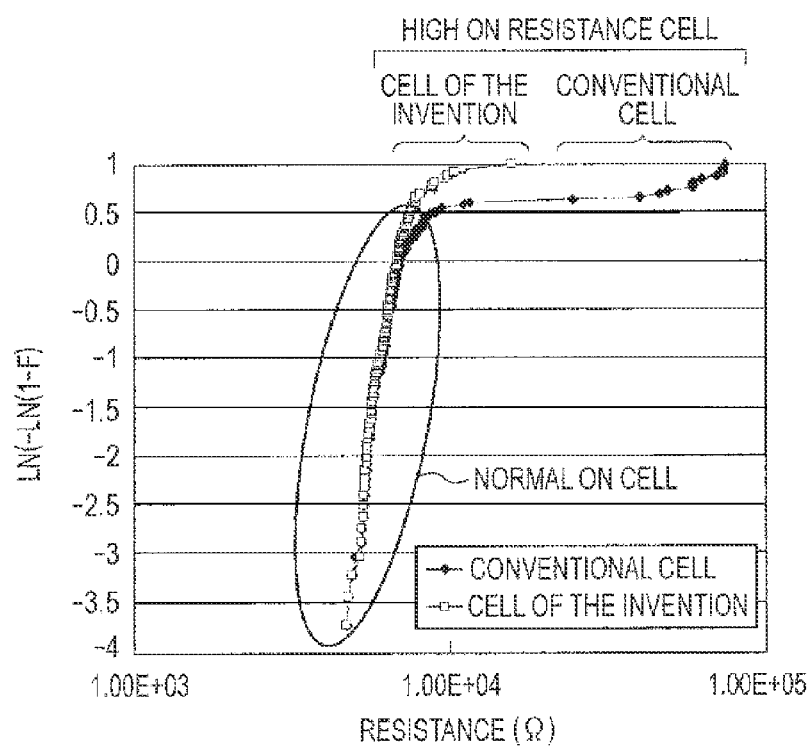
FIG. 7 is a graph for explaining the effect according to the first embodiment.

FIG. 6 and FIG. 7 illustrate Weibull distributions with respect to the resistance value of a number of cells (resistance change device) obtained as a result of the forming treatment. FIG. 6 illustrates a case where only the first forming treatment is carried out which corresponds to the case of the conventional technique. On the other hand, FIG. 7 illustrates a case where the second forming treatment is carried out succeeding to the first forming treatment.

In FIG. 6, considerable number of high ON resistance cells which are caused as a result of incomplete forming are confirmed. Due to the presence of the high ON resistance cells, dispersion of the resistance values increases. However, it can be seen from FIG. 7 that the high ON resistance cells are decreased greatly by performing the second forming treatment and the dispersion of the resistance values can be suppressed. That is, according to this embodiment, dispersion of the resistance values is decreased and characteristics of the resistance change memory are improved.

2. Second Embodiment

Figure 8:
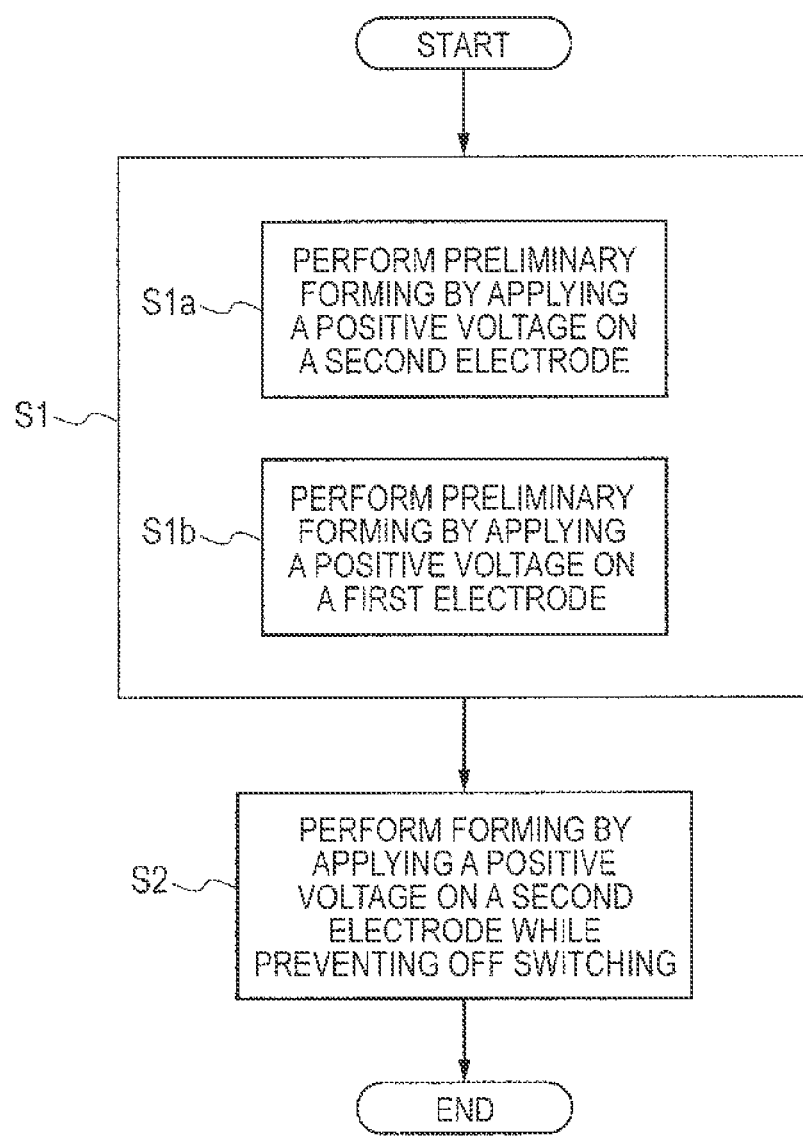
FIG. 8 is a flow chart illustrating a forming method according to a second embodiment.
Figure 9:
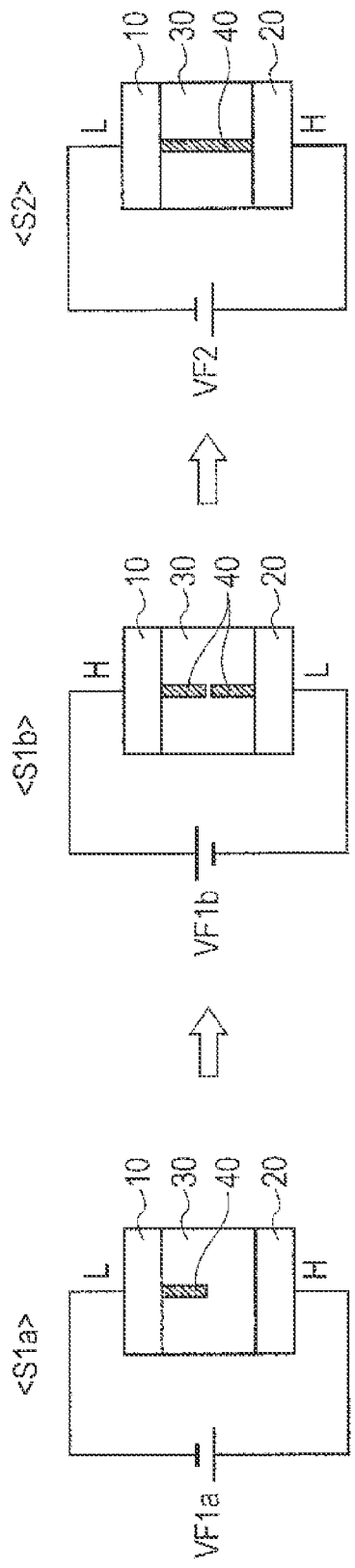
FIG. 9 is a conceptional view showing a forming treatment according to the second embodiment.

FIG. 8 is a flow chart showing a forming method according to a second embodiment. FIG. 9 is a conceptional view illustrating the forming treatment according to the second embodiment. The forming treatment according to the second embodiment is to be described with reference to FIG. 8 and FIG. 9. Descriptions overlapping with those of the first embodiment are to be omitted optionally.

In the second embodiment, the first forming treatment is performed in a multistage for lowering voltage and current. Specifically, the first forming treatment (step S1) includes a step S1a and a step S1b.

Step S1a:

A positive voltage VF1a is applied on a second electrode 20. In this case, electrons are injected from the first electrode 10 to the resistance change layer 30. As a result, as shown in FIG. 9, a filament 40 is formed so as to extend from the first electrode 10 to the resistance change layer 30. The positive voltage VF1a may be lower than the first positive voltage VF1 in the first embodiment.

Step S1b:

A positive voltage VF1b is applied on the first electrode 10. In this step, electrons are injected from the second electrode 20 to the resistance change layer 30. As a result, as shown in FIG. 9, a filament 40 is formed so as to extend from the second electrode 20 to the inside of the resistance change layer 30. The positive voltage VF1b may be lower than the first positive voltage VF1 in the first embodiment.

The sequence of the step S1a and step S1b may be reversed.

A second forming treatment (step S2) and a usual operation (ON/OFF switching) are identical with those in the first embodiment.

According to the second embodiment, the following effect is also obtained in addition to the effect according to the first embodiment. That is, by increasing the number of steps of voltage application, the applied voltage and the applied current can be decreased in each of the cycles.

Figure 10:
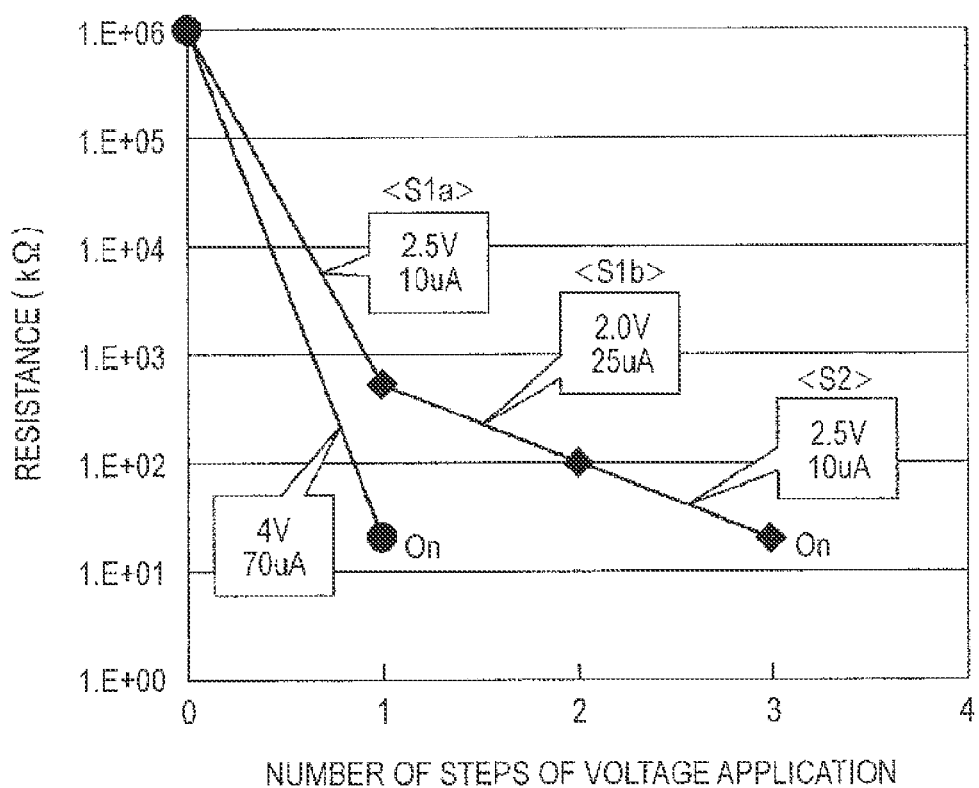
FIG. 10 is a graph for explaining the effect according to the second embodiment.

FIG. 10 shows the change of the resistance value by application of voltage during forming. The abscissa denotes the number of steps of application of voltage and the ordinate denotes the resistance value. It can be seen that the filament 40 is formed and the ON state is achieved by the application of voltage during forming. Further, it can be seen that the applied voltage and the applied current on each step cam be lowered when the forming is performed by application of voltage for three steps than that in the application of voltage for one step. That is, according to the second embodiment, the voltage and the current can be decreased.

Generally, applied voltage during forming is higher than the applied voltage during usual operation. Accordingly, while a transistor size that can withstand forming is necessary, this is not always necessary in usual operation. When the voltage and current required for the forming treatment are decreased, the transistor size can also be reduced by so much. This is preferred with a view point of the circuit area and the manufacturing cost.

3. Example of Circuit Configuration and Example of Voltage Application

Figure 11:
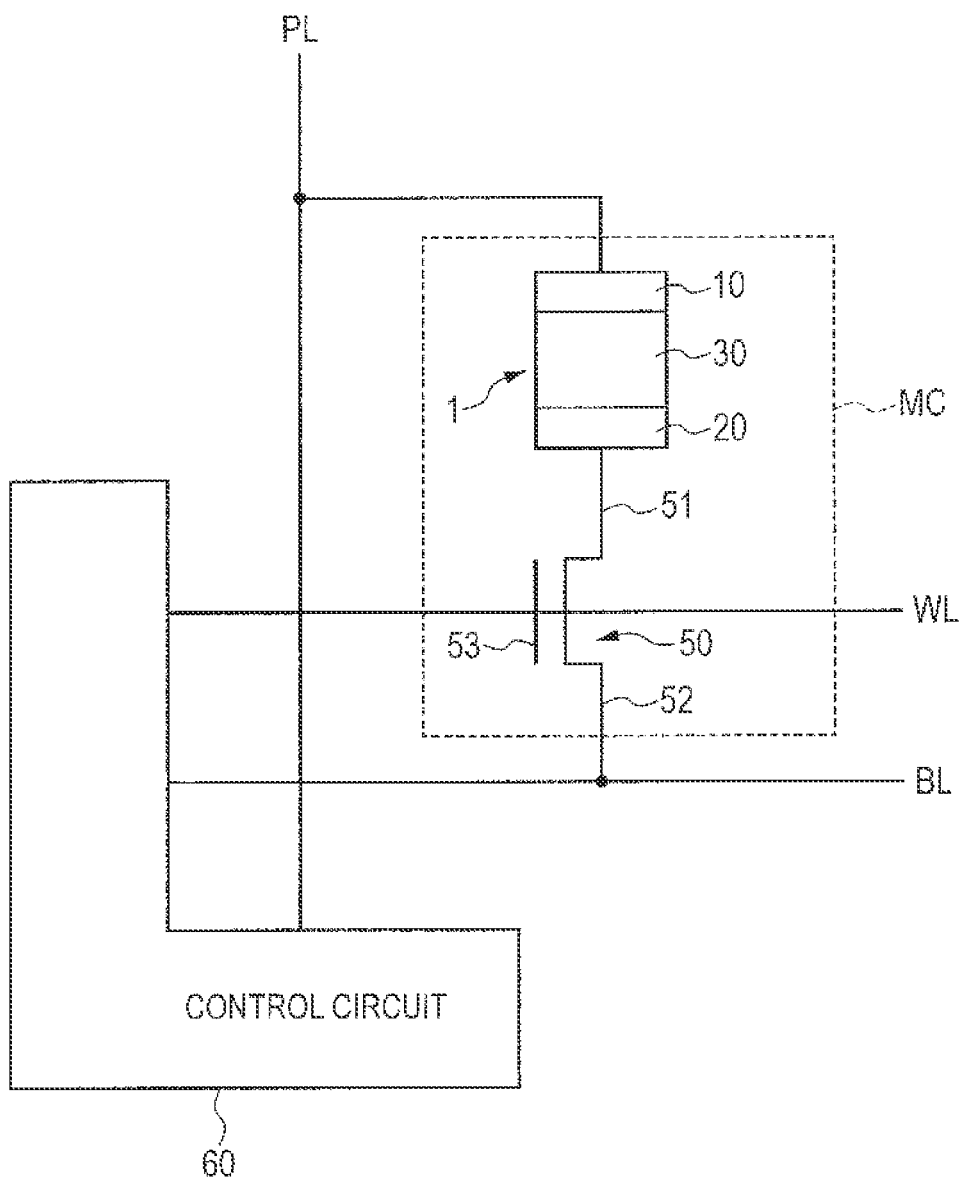
FIG. 11 schematically illustrates a configuration of resistance change memory according to the embodiment.

FIG. 11 schematically illustrates a configuration of a resistance change memory according to the embodiment. The resistance change memory has a memory cell MC. The memory cell MC has a resistance change device 1 and a transistor 50 (1T-1R cell configuration). A first electrode 10 of the resistance change device 1 is connected to a common line PL. A drain electrode 51 of the transistor 50 is connected to a second electrode 20 of the resistance change device 1. A source electrode 52 of the transistor 50 is connected to a bit line BL. A gate electrode 53 of the transistor 50 is connected to a word line WL.

A control circuit 60 controls application of voltage to the resistance change device 1. Specifically, the control circuit 60 is connected to the bit line BL, the word line WL, and the common line PL. The control circuit 60 applies appropriate voltages to the bit line BL, the word line WL, and the common line PL to perform a first forming treatment, a second forming treatment, an ON switching, and an OFF switching respectively.

The positive voltage is applied on the first electrode 10 as described below. The control circuit 60 applies a voltage at a high level to the word line WL. As a result, the transistor 50 turns ON to electrically connect the bit line BL and the second electrode 20 of the resistance change device 1. Further, the control circuit 60 applies a voltage at a high level to the common line PL and applies a voltage at a low level to the bit line BL. Thus, a positive voltage is applied on the first electrode 10.

The positive voltage is applied on the second electrode 20 as described below. The control circuit 60 applies a voltage at a high level to the word line WL. As a result, the transistor 50 turns ON to electrically connect the bit line BL and the second electrode 20 of the resistance change device 1. Further, the control circuit 60 applies a voltage at a low level to the common line PL and applies a voltage at a high level to the bit line BL. Thus, a positive voltage is applied on the second electrode 20.

3-1 Voltage Application on Every Memory Cell

Figure 12:
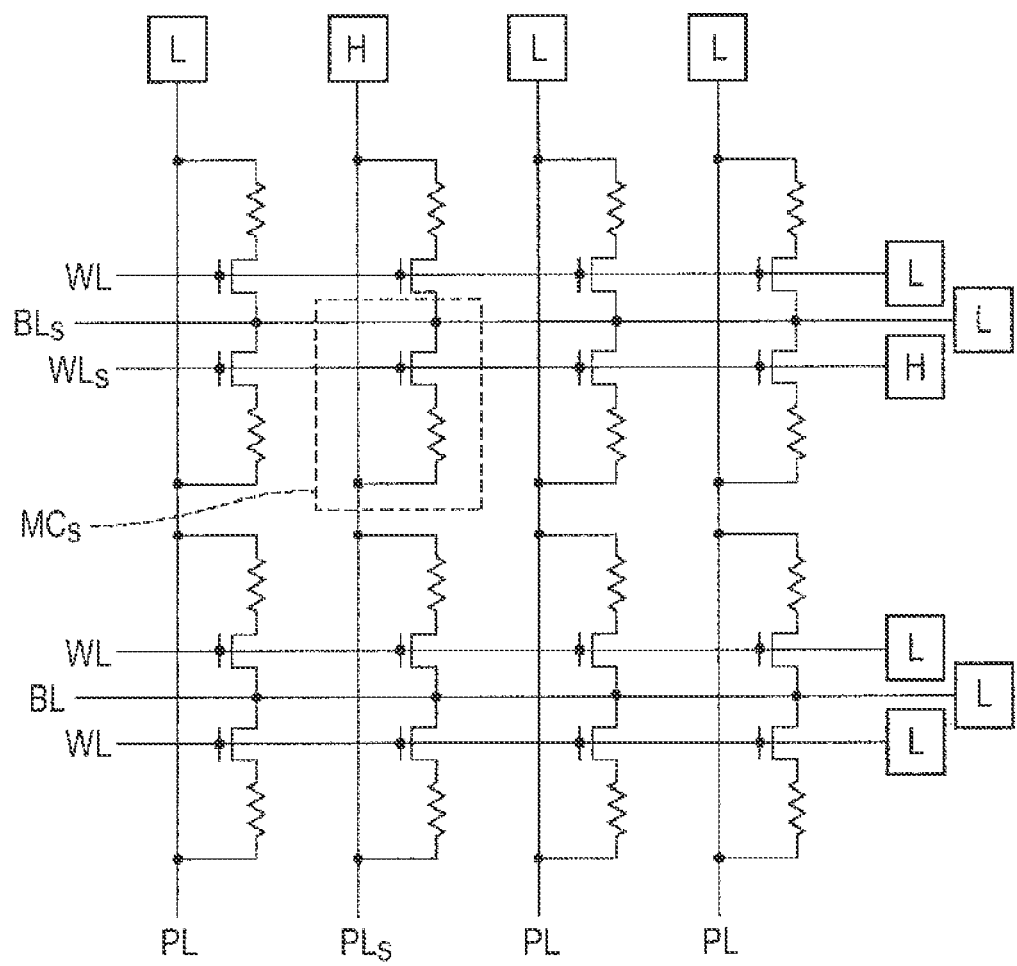
FIG. 12 illustrates an example of voltage application to a memory cell array in the embodiment.

The resistance change memory has a plurality of memory cells MC arranged in an array. Voltage is applied, for example, on every memory cell MC. The memory cell MC as a target of voltage application is hereinafter referred to as a selected memory cell MCs. Further, the word lines WL, the bit line BL, and the common line PL connected to the selected memory cells MCs are referred to as a selected word line WLs, a selected bit line BLs, and a selected common line PLs, respectively, FIG. 12 illustrates a state when a positive voltage is applied on the first electrode 10 of the resistance change device 1 of the selected memory cell MCs, the control circuit 60 is not illustrated. The control circuit 60 applies a voltage at a high level to the selected word line WLs, applies a voltage at a low level to the selected bit line BLs, and applies a voltage at a high level to the selected common line PLs. Thus, a positive voltage is applied on the first electrode 10 of the resistance change device 1 of the selected memory cell MCs.

Further, the control circuit 60 applies a voltage at a low level to other word lines WL than the selected word line WLs. Further, the control circuit 60 applies a voltage at a low level to other bit lines BL than the selected bit line BLs, and applies a voltage at a low level to other common lines PL than the selected common line PLs. Thus, application of voltage between the first electrode 10 and the second electrode 20 in other memory cells MC than the selected memory cell MCs is inhibited.

Figure 13:
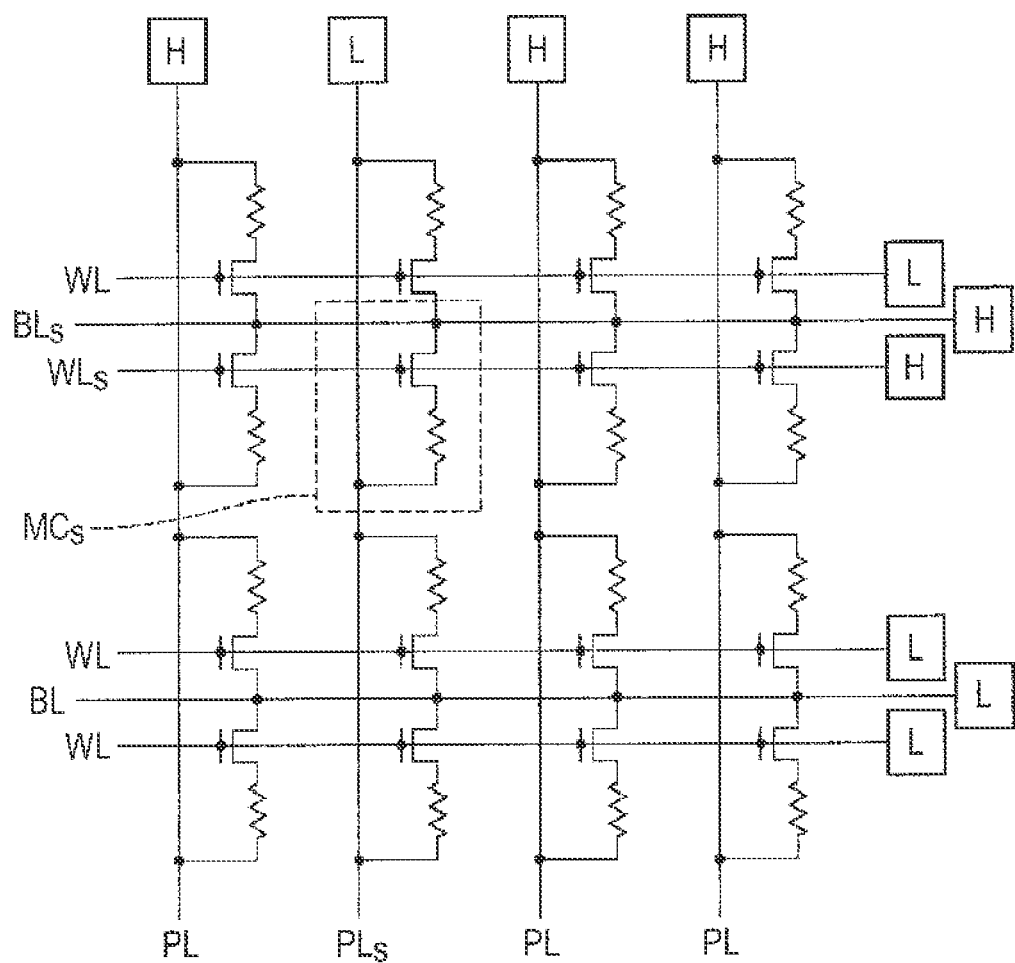
FIG. 13 illustrates another example of voltage application to the memory cell array in the embodiment.

FIG. 13 illustrates a state when a positive voltage is applied on the second electrode 20 of the resistance change device 1 of the selected memory cell MCs. The control circuit 60 applies a voltage at a high level to the selected word line WLs, applies a voltage at a high level to the selected bit line BLs, and applies a voltage at a low level to the selected common line PLs. Thus, a positive voltage is applied on the second electrode 20 of the resistance change device 1 of the selected memory cell MCs.

Further, the control circuit 60 applies a voltage at a low level to other word lines WL than the selected word line WLs. Further, the control circuit 60 applies a voltage at a low level to other bit lines BL than the selected bit line BLs, and applies a voltage at a high level to other common lines PL than the selected common line PLs. Thus, application of voltage between the first electrode 10 and the second electrode 20 in other memory cells MC than the selected memory cell MCs is inhibited.

3-2 Collective Voltage Application to a Plurality of Memory Cells

The voltage may be applied collectively to a plurality of memory cells MC. For example, voltage can be applied simultaneously also to all of the memory cells MC in the memory cell array.

Figure 14:
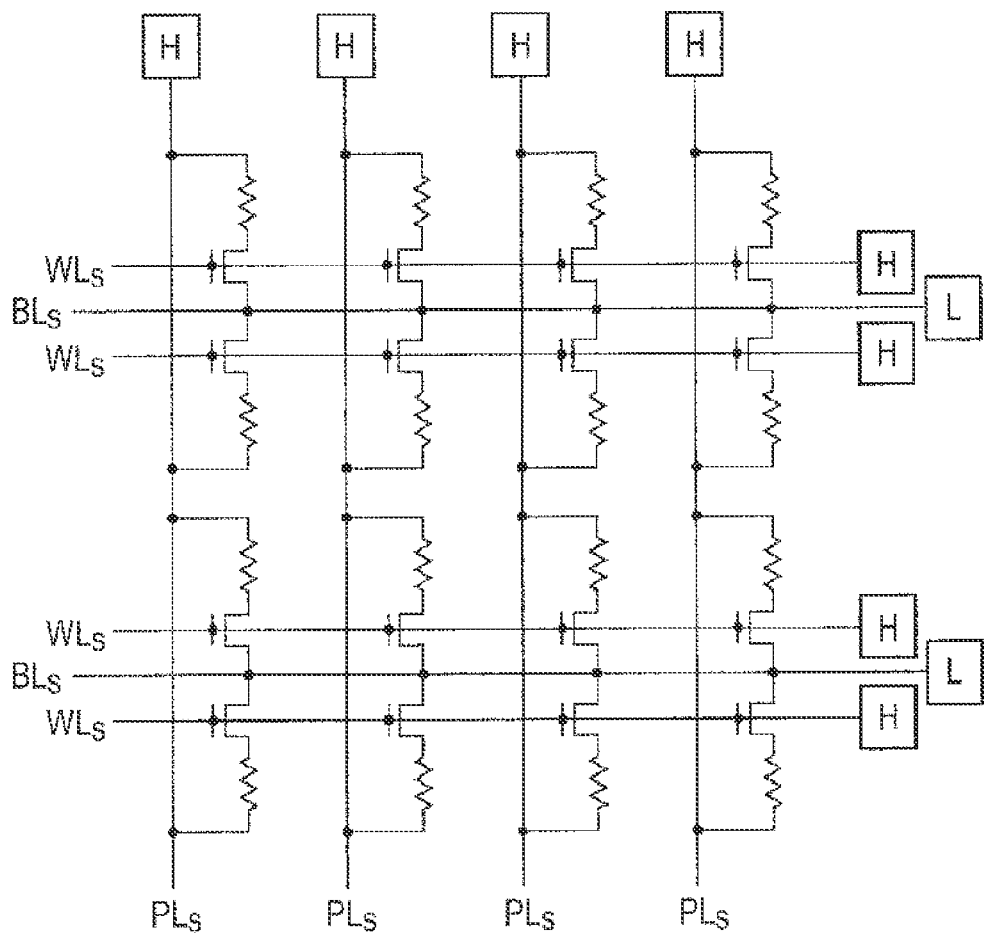
FIG. 14 illustrates a further example of voltage application to the memory cell array in the embodiment.

FIG. 14 illustrates a case in which a positive voltage is applied on the first electrode 10 of the resistance change device 1 in all of the memory cells MC. In this case, all of the memory cells MC are selected memory cells MCs. The control circuit 60 applies a voltage at a high level to the selected word line WLs, applies a voltage at a low level to the selected bit line BLs, and applies a voltage at a high level to the selected common line PLs. Thus, a positive voltage is applied on the first electrode 10 of the resistance change device 1 in all of the memory cells MC.

Figure 15:
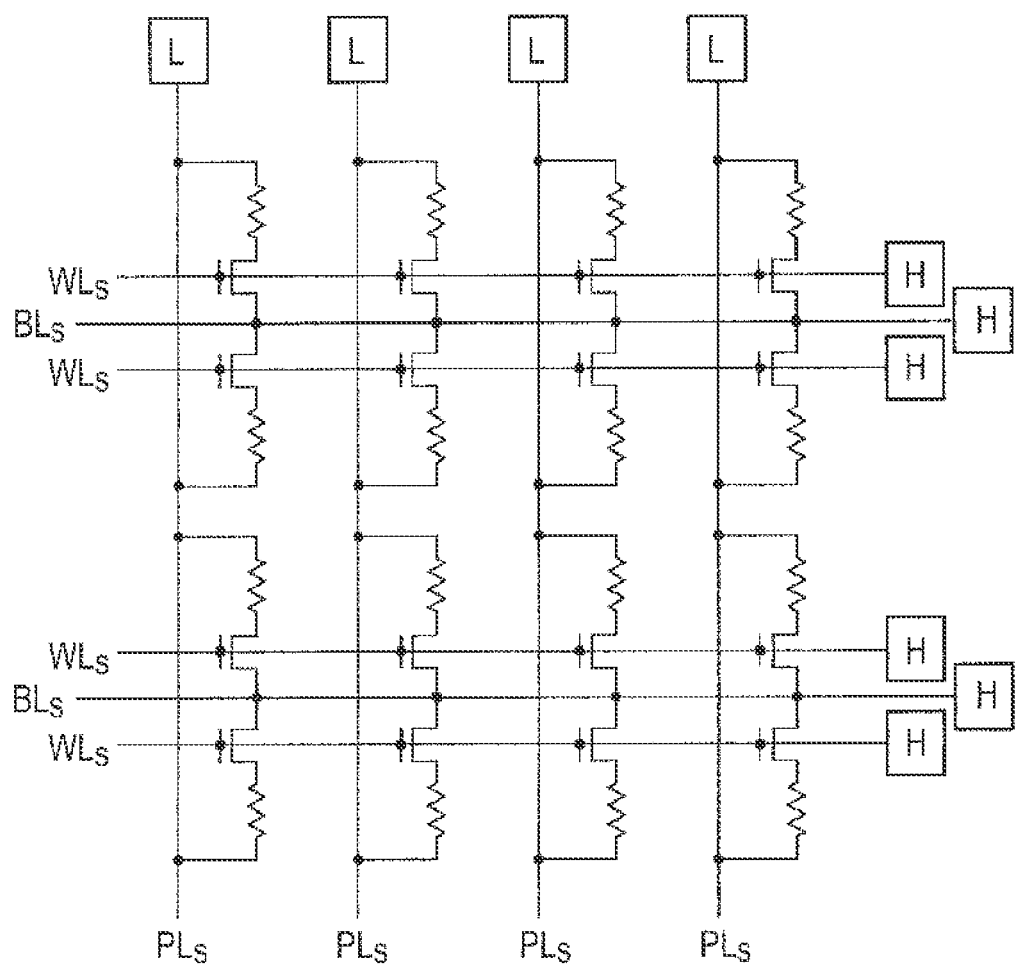
FIG. 15 illustrates a still further example of voltage application to the memory cell array in the embodiment.

FIG. 15 illustrates a case in which a positive voltage is applied on the second electrode 20 of the resistance change device 1 in all of the memory cells MC. In this case, all of the memory cells MC are selected memory cells MCs. The control circuit 60 applies a voltage at a high level to the selected word line WLs, applies a voltage at a high level to the selected bit line BLs, and applies a voltage at a low level to the selected common line PLs. Thus, the positive voltage is applied on the second electrode 20 of the resistance change device 1 in all of the memory cells MC.

By the voltage application as described above, the control circuit 60 can perform forming collectively to the plurality of memory cells MC (resistance change device 1). As a result, the processing time required for the forming to the entire resistance change memory can be shortened and the cost is also saved.

In this embodiment, it is not judged after the first forming treatment whether the second forming treatment is performed or not in accordance with the state of electric conduction. The first forming treatment and the second forming treatment are performed as a set. Therefore, collective forming for the plurality of memory cells MC is possible.

While the invention made by the present inventors has been described specifically with reference to the preferred embodiments, it will be apparent that the invention is not restricted to the embodiments but can be modified variously within a range not departing the gist thereof.

What is claimed is:
1. A resistance change memory comprising:
    a resistance change device having a first electrode, a second electrode, and a resistance change layer interposed between the first electrode and the second electrode, the second electrode including at least one of members selected from among the group consisting of W, Ti, Ta, and nitrides thereof; and a control circuit configured to control application of voltage to the resistance change device, and perform an initial utilization treatment to form the resistance change device, the initial utilization treatment including a first forming process and then a second forming process, wherein the first forming process forms a first portion of a filament and includes application of voltage such that the potential of the first electrode is higher than the potential of the second electrode, and the second forming process forms a second portion of the filament and includes application of voltage such that the potential of the second electrode is higher than the potential of the first electrode, the first and second portions of the filament form a conductive path between the first electrode and the second electrode.

2. The resistance change memory according to claim 1, wherein
the material for the second electrode is W or Ti.

3. The resistance change memory according to claim 1, wherein
the free energy for oxide formation of the first electrode is lower than the free energy for oxide formation of the second electrode.

4. The resistance change memory according to claim 1, wherein
the voltage applied between the first electrode and the second electrode in the second forming process is equal to or is lower than the voltage applied between the first electrode and the second electrode in the first forming process.

5. The resistance change memory according to claim 1, wherein
the first forming process further includes application of voltage such that the potential on the second electrode is higher than the potential on the first electrode.

6. The resistance change memory according to claim 1, wherein
the control circuit is further configured to perform an initial utilization treatment of the resistance change device collectively for a plurality of resistance change devices.

7. The resistance change memory according to claim 1, wherein
the control circuit is further configured to perform an OFF switching treatment of increasing the resistance value of the resistance change device and an ON switching treatment of decreasing the resistance value of the resistance change device in a usual operation, in which the OFF switching treatment includes application of voltage such that the potential of the first electrode is higher than the potential of the second electrode, and the ON switching treatment includes application of voltage such that the potential of the second electrode is higher than the potential of the first electrode.

8. An initial utilization treatment method for forming a resistance change device including a first electrode, a second electrode, and a resistance change layer interposed between the first electrode and the second electrode, the second electrode includes at least one of members selected from among the group consisting of W, Ti, Ta, and nitrides thereof, the initial utilization treatment method comprising:

a first forming process, and a second forming process performed after the first forming treatment, wherein the first forming process forms a first portion of a filament, and includes application of voltage such that the potential of the first electrode is higher than the potential of the second electrode, and wherein the second forming process forms a second portion of the filament, and includes application of voltage such that the potential of the second electrode is higher than the potential of the first electrodes, and wherein the first and second portions of the filament form a conductive path between the first electrode and the second electrode.

9. The initial utilization treatment method according to claim 8, wherein
the first forming process further includes application of voltage such that the potential of the second electrode is higher than the potential of the first electrode.

* * * * *